United States Patent [19]
Ehman et al.

[11] Patent Number: 5,185,574
[45] Date of Patent: Feb. 9, 1993

[54] NMR MEASUREMENTS USING RECURSIVE RF EXCITATION

[75] Inventors: Richard L. Ehman; James F. Greenleaf, both of Rochester, Minn.

[73] Assignee: Mayo Foundation for Medical Education and Research, Rochester, Minn.

[21] Appl. No.: 342,980

[22] Filed: Aug. 9, 1991

[51] Int. Cl.⁵ .......................................... G01R 33/20
[52] U.S. Cl. .................................. 324/309; 324/307
[58] Field of Search ............... 324/300, 303, 306, 307, 324/309, 310, 311, 312, 313, 314, 318, 322; 128/653.2, 653.5, 653.3

[56]  References Cited
U.S. PATENT DOCUMENTS 4,973,906 11/1990 Bernstein .......................... 324/309
5,023,551 6/1991 Kleinberg et al. ................. 324/303
5,025,216 6/1991 Pauly et al. ........................ 324/309
5,079,504 1/1992 Machida ............................ 324/309
5,103,175 4/1992 Kimmich et al. .................. 324/309
5,125,407 6/1992 Harms et al. ...................... 128/653.2
5,133,357 7/1992 Dumoulin et al. ................ 128/653.3
5,140,268 8/1992 Chan .................................. 324/314

Primary Examiner—Michael J. Tokar
Attorney, Agent, or Firm—Quarles & Brady

[57] ABSTRACT

An NMR echo signal is produced in a recursive process in which one or more pulse sequences are executed and the NMR echo signal produced by each pulse sequence is employed to shape the RF excitation pulse employed in the subsequent pulse sequence. The series of NMR echo signals produced by this recursive process are progressively modified to enhance the signals produced by prominent features in the subject.

13 Claims, 7 Drawing Sheets

NMR MEASUREMENTS USING RECURSIVE RF EXCITATION

BACKGROUND OF THE INVENTION

The field of the invention is nuclear magnetic resonance methods and systems. More particularly, the invention relates to the RF excitation of spins.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal. In a two-dimensional implementation of the well known Fourier transform imaging technique (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the direction of the readout gradient. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views, such as that produced by patient movement during respiration, the cardiac cycle, or peristalsis, is referred to as "view-to-view motion". Motion may also change the amplitude and phase of the NMR signal as it evolves during the pulse sequence and such motion is referred to as "in-view motion".

There are numerous methods currently employed to reduce motion artifacts and many of these methods require that the motion of the patient be accurately determined. Such motion detection is accomplished, for example, with respirometers which are employed to measure patient respiration, electrocardiograms which are employed to measure motion produced by the cardiac cycle, and position sensors which are employed to measure the motion of a patient's chest. Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view.

In U.S. Pat. No. 4,937,526 entitled "Adaptive Method For Reducing Motion and Flow Artifacts In NMR Images", a method is described for correcting the NMR image data set for motion effects after the data has been acquired. This retrospective technique for correcting the acquired image data requires that the patient motion be measured so that the corrective values can be calculated. While physical devices such as a respirometer can be used, the preferred method of motion measurement is to employ the NMR instrument itself. This is accomplished by acquiring "navigator" NMR signals during the scan and analyzing those signals to measure patient motion. These navigator signals are produced throughout the scan and they are non-phase encoded NMR signals which indicate the spin density in a projection along the readout gradient axis. Patient motion is determined by picking out a prominent feature in this projection data and following the motion of that feature along the readout gradient axis. The difficulty with this method is that it is often difficult to accurately pick out the same prominent feature in the NMR projection data during the entire scan. Thus, a method for enhancing the NMR signal produced by this prominent feature would greatly facilitate the use of this navigator NMR signal to correct for motion effects.

Yet another method for reducing image artifacts due to patient motion is to suppress the NMR signal produced by prominent features. For example, in U.S. Pat. No. 4,715,383 a method is described in which the NMR signals produced by spins located outside the region of interest and which might produce motion artifacts in the reconstructed image are suppressed by the application of RF excitation pulses which saturate the spins. Prior to the acquisition of NMR signals from the region of interest, one or more selective RF saturation pulses are applied in the presence of a magnetic field gradient. The RF pulses and the accompanying field gradient are chosen to excite the spins in a slab alongside the region of interest and to thereby saturate them so that they do not produce any significant NMR signal during the subsequent pulse sequence which acquires NMR data from within the region of interest. While this technique is very effective when the offending spins are located outside the region of interest, there is no method for selectively saturating offending spins located within the region of interest without also suppressing the NMR signals needed to reconstruct the image. In other words, there is a need for a method for suppressing the NMR signal produced by prominent features within the field-of-view of the image being produce.

SUMMARY OF THE INVENTION

The present invention relates to an NMR method and apparatus for magnifying features and filtering out features in an NMR signal. More specifically, the present invention is a method and apparatus for performing an NMR measurement in which a set of NMR pulse sequences are executed to produce a corresponding set of NMR echo signals, and each NMR echo signal is employed to determine the RF excitation pulse in the following pulse sequence. By employing the NMR echo signal as the RF excitation pulse for the following pulse sequence, features which are prominent in the NMR echo signal are magnified in the subsequent pulse sequence because they receive more, RF excitation. This magnification continues in subsequent iterations while background noise is diminished in magnitude.

A general object of the invention is to enhance prominent features in an NMR echo signal. When the signals produced by prominent features are to be magnified and other signals are to be suppressed, the acquired and digitized NMR echo signal may be used directly to modulate the amplitude of the RF excitation pulse in the next pulse sequence. By repeating this sequence the signals produced by prominent features are magnified during each iteration and the background noise is suppressed.

Another object of the invention is to provide an NMR signal which may be employed to monitor patient motion. When NMR projection data is acquired through the abdominal cavity the layer of fat in the anterior wall of the abdominal cavity is a prominent feature. By employing the recursive process of the present invention this dominant feature is magnified and can be easily identified and located by numerical analysis. The location of this feature is an indication of patient motion which can be used in many of the known motion artifact suppression techniques.

Yet another object of the invention is to suppress, or filter out, the NMR signal produced by prominent features. When the abdominal cavity is imaged the fat layer in the anterior wall appears very intense. If motion artifacts are not completely suppressed, this intense signal may be smeared or may produce ghosts which obscure important features in the image. By employing the recursive process of the present invention this prominent feature can be suppressed so that it does not dominate the resulting image. The NMR signal is transformed into image space, the offending feature is identified and removed from the image data and the filtered image data is converted back to K-space where it is used to modulate the amplitude of the RF excitation pulse in the next pulse sequence. During the subsequent pulse sequence the prominent feature is not excited to the same extent as the other spins in the field of view and its signal is thereby suppressed and its effect on the resulting image is reduced.

Yet another object of the invention is to provide a selective RF s~'uration pulse which will suppress the signal produced by prominent features within the field of view of the image. By employing the recursive technique of the present invention prior to the acquisition of image data, prominent features may be selectively saturated just prior to the image data acquisition. Thus, a prominent feature, such as the fat layer in the patient's anterior abdominal wall, will be suppressed in the resulting image.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
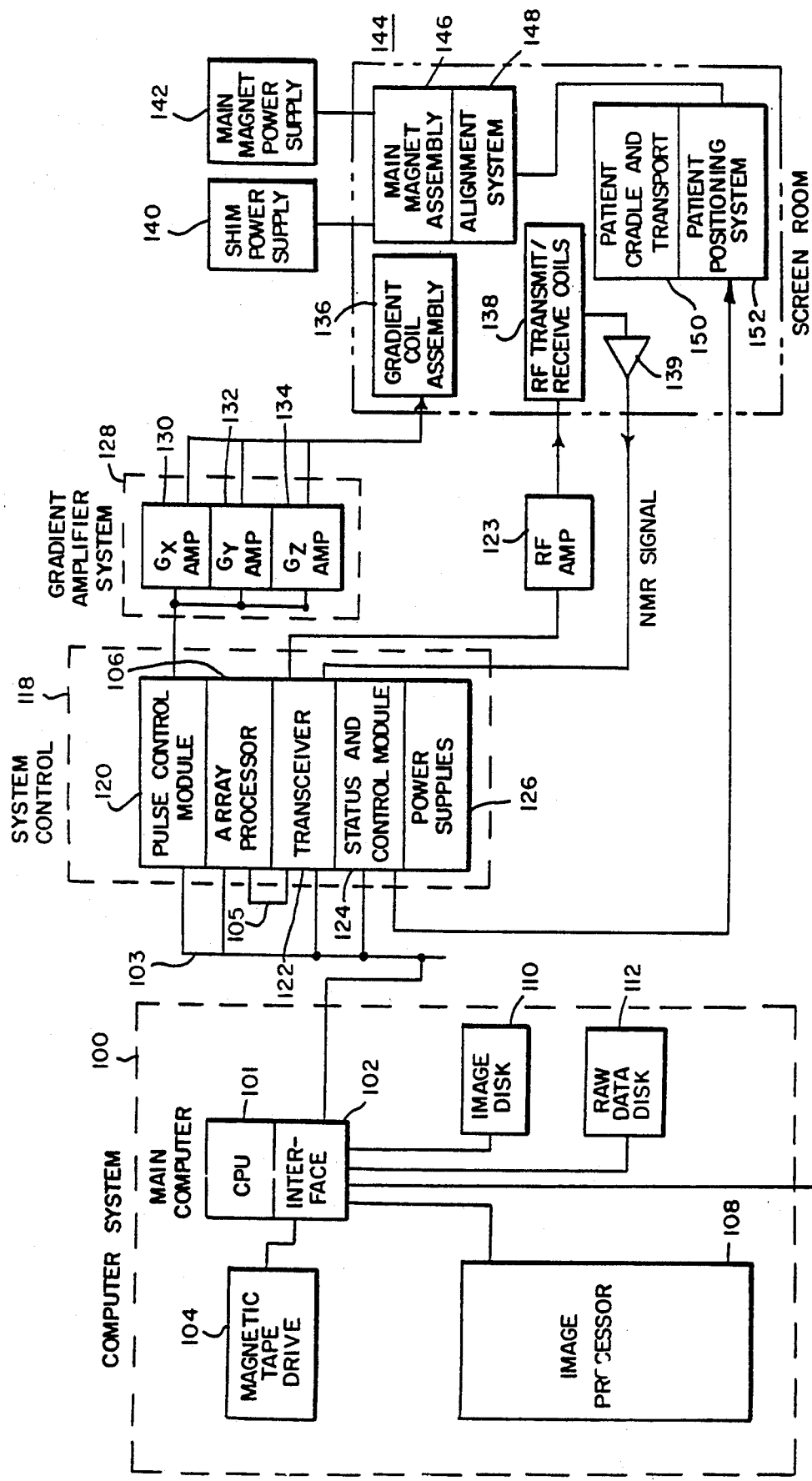
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z / \partial x$, $G_y = \partial B_z / \partial y$ and $G_z = \partial B_z / \partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
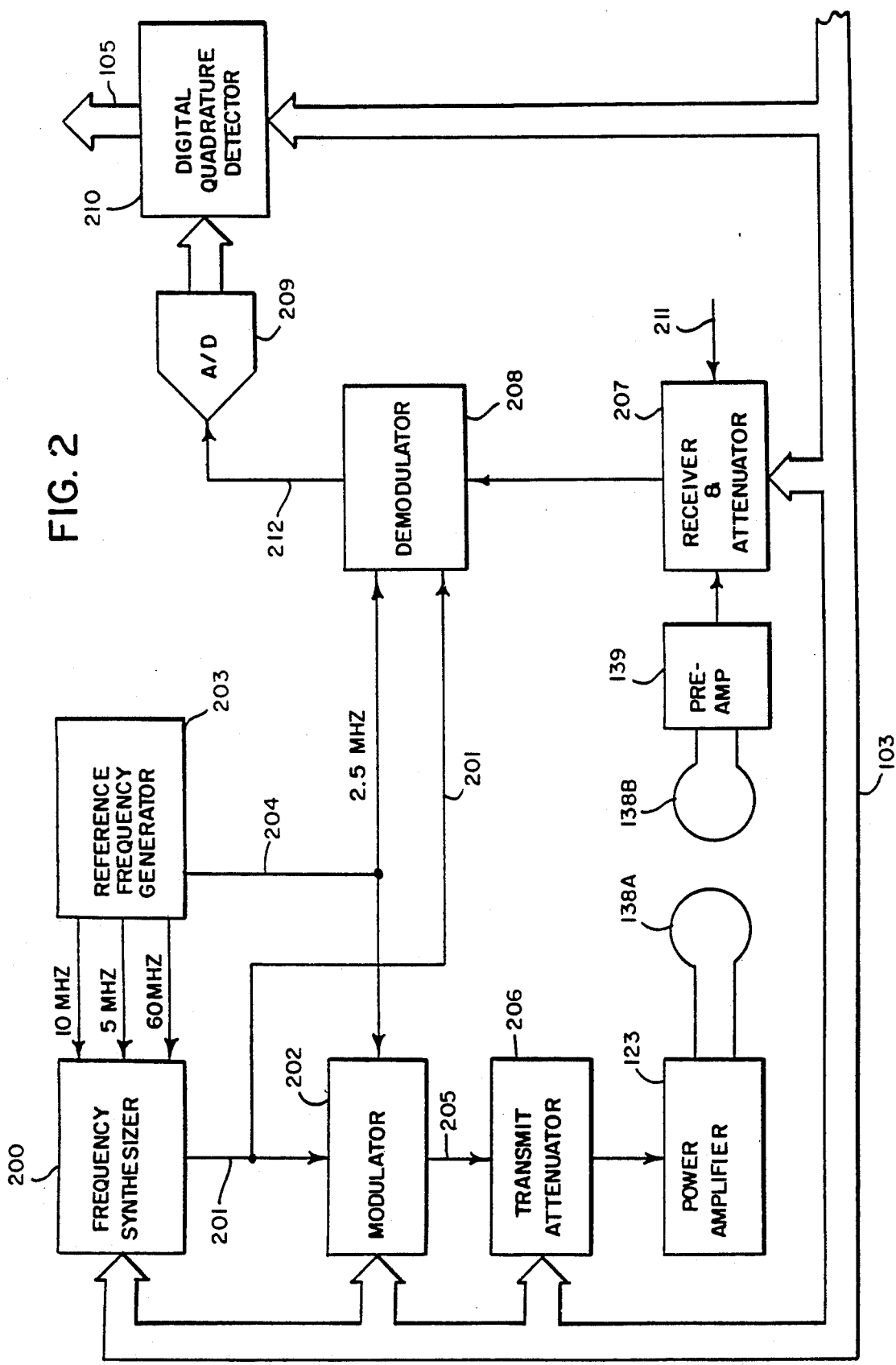
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading a series of stored 16-bit digital values out of pulse shape look-up table that represent the desired envelope. These stored digital values are "played out" by a 1 MHz clock signal as the RF excitation pulse is produced, and these values may be changed by the computer 100 to enable any desired RF pulse envelope to be produced.

The RF excitation pulse may range from 0.5 to 10 milliseconds in most NMR measurements, but an RF excitation pulse of 8 milliseconds is employed in the preferred embodiment of the present invention. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which issued on Aug. 28, 1990 and which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor 106 where they are typically employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

To practice the present invention a series of pulse sequences are performed in which the envelope R(t) used to modulate the RF excitation pulse is changed for each pulse sequence. The new envelope R(t) is produced from the NMR signal acquired during the previous pulse sequence. This is accomplished under the direction of the main computer 101, which reads the digitized values of the acquired NMR signal from the array processor 106, modifies them as will be described in detail below, and then writes them back to the pulse shape look-up table in the PCM 120.

The pulse sequence used to practice the first preferred embodiment of the invention is interlaced into a normal scan for the purpose of acquiring a "navigator" signal as described in U.S. Pat. No. 4,937,526. No phase encoding gradients are employed and this navigator signal is a projection of the spin density along the readout gradient axis through the patient. The navigator signal is used to measure patient motion during the scan so that the image data which is being acquired can be corrected to suppress motion artifacts. The navigator signal is examined to determine the shift in prominent features in the projection data and this shift is used to calculate the necessary correction in the image data.

Figure 3:
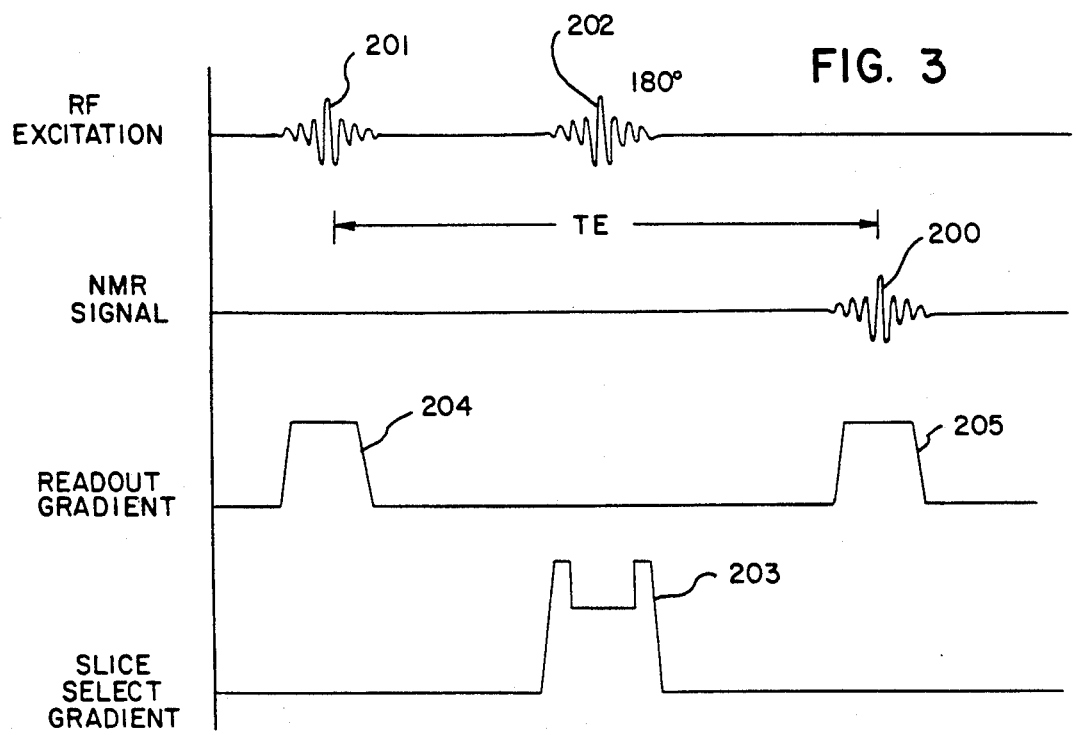
FIG. 3 is a pulse sequence which is employed in the NMR system of FIG. 1 to practice the preferred embodiment of the invention.

Referring particularly to FIG. 3, the navigator pulse sequence produces an NMR echo signal 200 at an echo time TE=25 milliseconds after the application of an RF excitation pulse 201. The excited spins are refocused at the echo time TE by an RF echo pulse 202 which is produced while a slice select gradient pulse 203 is generated. The RF echo pulse 202 is modulated with a conventional SINC pulse envelope so that spins are uniformly reversed in phase within the selected slice.

The initial pulse sequence in the recursive process employs a conventional SINC modulation envelope for the RF excitation pulse 201. It is produced in the presence of a readout gradient pulse 204 such that the spins are excited uniformly throughout the field of view along the readout gradient axis. The magnitude of the readout gradient pulse 204 is set to provide the desired field of view, and it has a duration equal to the duration of the RF excitation pulse 201 (8 milliseconds). An identical readout gradient pulse 205 is produced while the NMR echo signal 200 is acquired. As a result, the NMR echo signal 200 is frequency encoded to locate spins along the readout gradient axis over the same field of view.

To practice the present invention the pulse sequence of FIG. 3 is repeated a number of times with the demodulated NMR echo signal 200 from each pulse sequence used as the modulation waveform R(t) for the RF excitation pulse 201 in the next pulse sequence. The amount of RF excitation applied to spins distributed along the readout gradient axis in the second and subsequent iterations is thus determined by the amount of signal those spins produced during the previous pulse sequence. As a result, the signal produced by a prominent feature in the subject of interest will be magnified by each iteration in this recursive process.

Figure 4A:
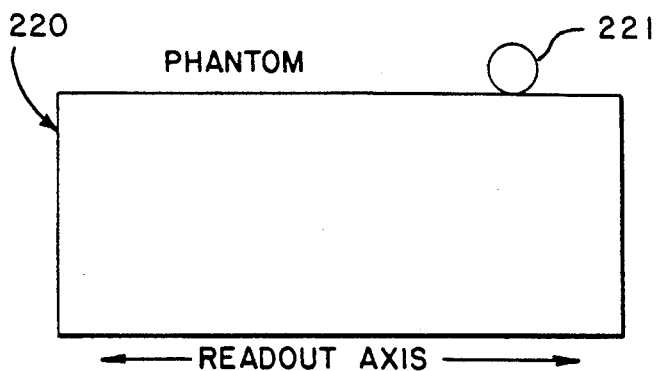
FIG. 4a is a cross section taken through a phantom used to illustrate the function performed by the pulse sequence of FIG. 3.
Figure 4B:
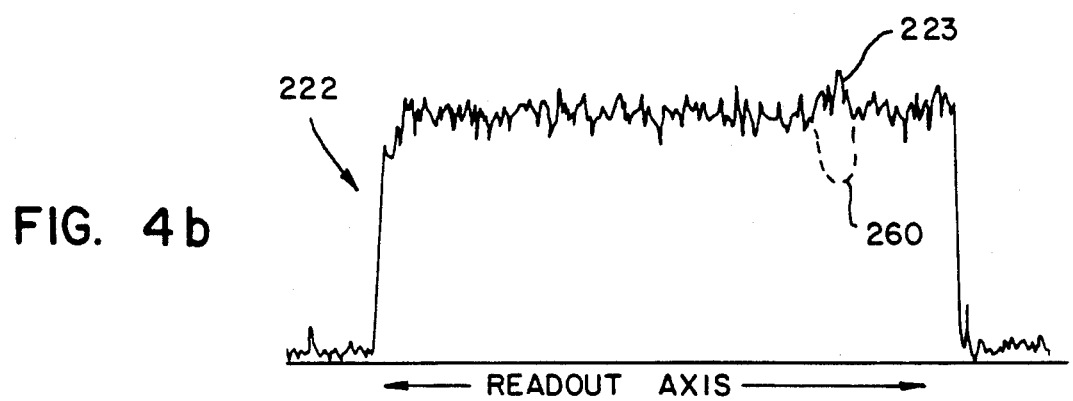
FIG. 4b is NMR projection data acquired on the phantom of FIG. 4a using the pulse sequence of FIG. 3.
Figure 4C:
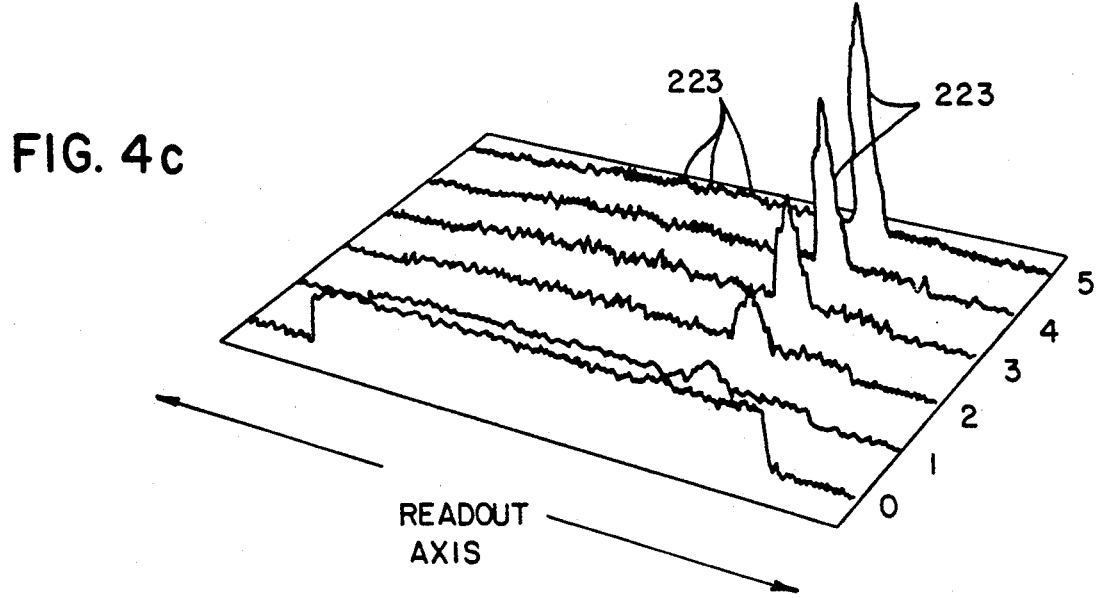
FIG. 4c is a graphic representation of how the projection data from the phantom of FIG. 4a evolves when the pulse sequence of FIG. 3 is used in the recursive process according to the present invention.

The effect of this recursive process is illustrated in FIGS. 4a-4c. Referring to FIG. 4a, a phantom made of a uniform gel material 220 has a small gel-filled tube 221 placed on top. A simple projection 222 of this phantom using the pulse sequence of FIG. 3 is shown in FIG. 4b. This simple projection is produced using an RF excitation pulse which uniformly excites the spins in the phantom along the readout gradient axis (i.e. SINC waveform). The resulting NMR echo signal is acquired and a fast Fourier transformation is performed to produce the projection 222. A small peak 223 is produced at the location corresponding to the gel-filled tube 221, but this peak 223 is not particularly distinct from the background noise.

The graph in FIG. 4c illustrates the change that occurs in the projection of this phantom during each iteration of the recursive process of the present invention. During each of the subsequent five iterations, the magnitude of the peak 223 is magnified in relation to the rest of the acquired signal, and it clearly dominates the projection in the output of the fifth iteration. This peak 223 can thus easily be located using numerical methods and its location along the readout axis can be precisely determined. For example, if the peak 223 is the increased signal produced by the layer of fat in a patient's anterior abdominal wall, its location along the readout axis is a measure of the position of this fat layer and the patient's respiration.

Figure 5:
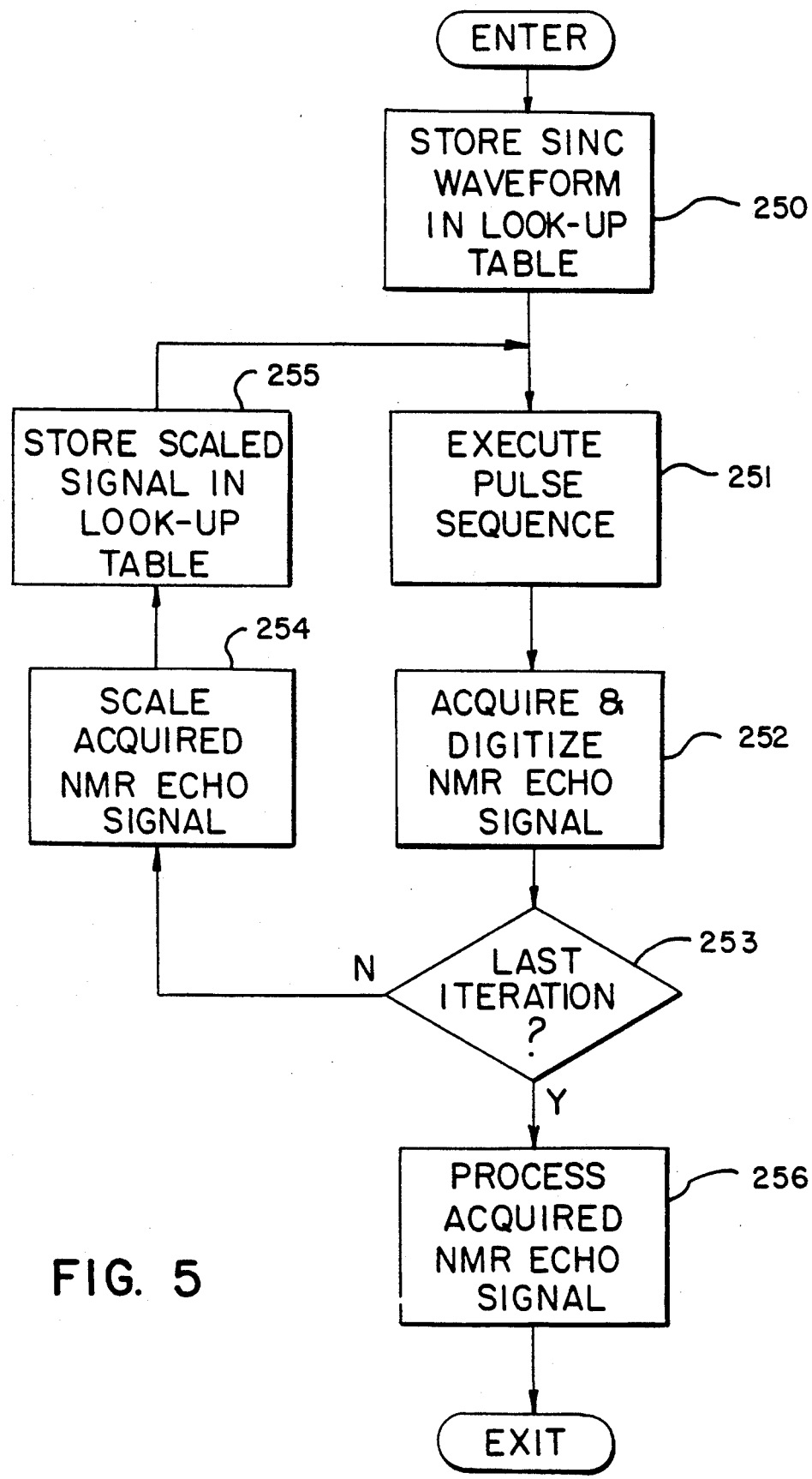
FIG. 5 is a flow chart of the program which directs the NMR system of FIG. 1 to carry out the recursive process of the present invention

The recursive method of the present invention is carried out under the direction of a program which is executed by the main computer 101 and which is illustrated in FIG. 5. As indicated at process block 250, the computer selects a conventional SINC waveform and stores it in the pulse shape look-up table in the PCM 120. The PCM 120 is then enabled to execute the pulse sequence of FIG. 3, as indicated at process block 251 and the resulting NMR echo signal is acquired and digitized at process block 252. A check is made at decision block 253 to determine if enough iterations of the process have been performed, and if not, the system loops back to repeat the process. However, on subsequent iterations the acquired NMR echo signal is used to modulate the RF excitation pulse 201 rather than the SINC waveform. As indicated at process block 254, the 256 samples of the acquired NMR echo signal are read from the array processor 106 where they are stored, and they are scaled in value such that the highest peak in the NMR echo signal is set to an RF level which produces a tip angle of 90° in the excited spins. This scaled waveform is then written to the pulse shape look-up table in the PCM 120 as indicated at process block 255, and another iteration of the pulse sequence is performed.

When the last iteration of the process is completed as determined at decision block 253, the acquired NMR echo signal is used in the process of image reconstruction, as indicated at process block 256. As indicated above, in the first preferred embodiment the NMR echo signal is employed as a navigator signal in the motion artifact suppression technique described in U.S. Pat. No. 4,937,526.

Recursive RF excitation according to the present invention can also be employed to filter out prominent features in the acquired NMR signal. Using the phantom of FIG. 4a, for example, the present invention can be used to filter out the signal produced by the tube 221. To accomplish this, the pulse sequence of FIG. 3 is employed to produce an echo signal 200 as described above. But, instead of using that echo signal 200 to modulate the amplitude of the next RF excitation pulse, the echo signal 200 is Fourier transformed to produce the projection 222 shown in FIG. 4b. The peak 223 is then located in this projection data 222 along the readout axis and the projection data at this readout axis location is reduced in value to create a notch therein as indicated by the dashed line 260. This "filtered" projection data 222 is then inverse Fourier transformed back to k-space to produce a corresponding "filtered" echo signal which is then used as described above to modulate the amplitude of the next RF excitation pulse. As a result, during this next iteration the spins in the gel-filled tube are not excited to the same extent as the spins in the phantom 220 and they do not produce a prominent peak in the subsequent NMR echo signal.

Figure 6:
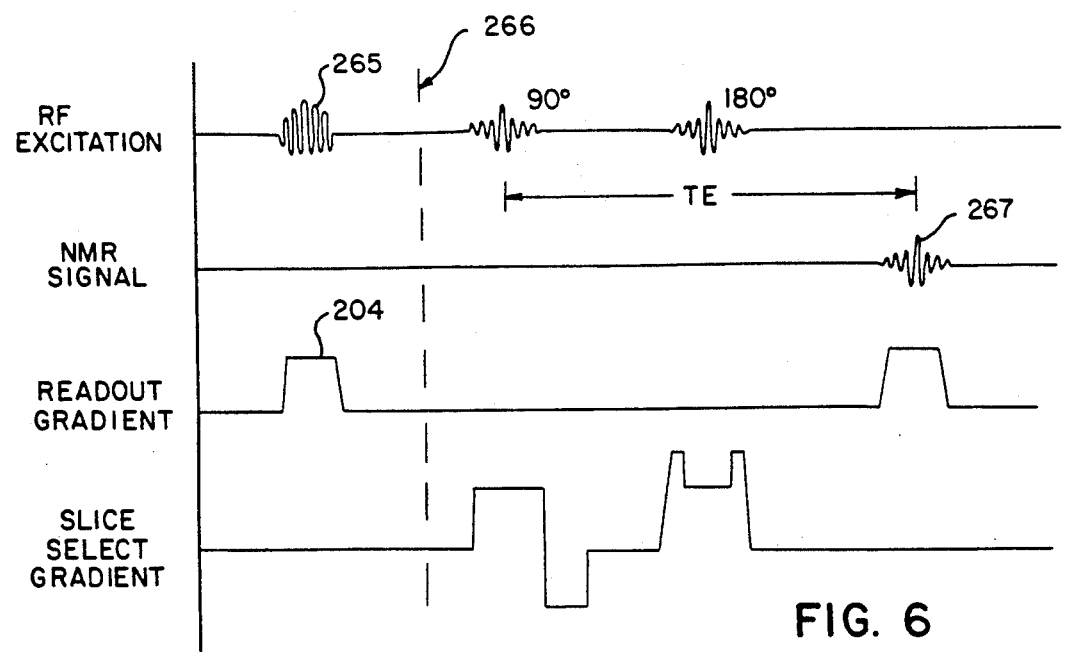
FIG. 6 is a pulse sequence employed in the NMR system of FIG. 1 to practice an alternative embodiment of the invention.

This filtering process can be implemented in a variety of ways. For example, the recursive RF excitation process can first be used as described above to enhance the prominent signal in the acquired NMR data produced by the tube 221. After a number of iterations (for example, 5) the acquired NMR echo signal is Fourier transformed to produce projection data as shown in FIG. 4c. This "enhanced" projection data is then examined along the readout axis and is used to locate where the notch 260 is to be located and how big it should be. In the preferred embodiment this examination of the enhanced projection data is done by comparing each value along the readout axis with an operator adjustable threshold value. At locations where this threshold is exceeded (i.e. prominent peaks as defined by the operator) the excess is subtracted from the corresponding data in the projection 222 (FIG. 4b) to form the notch 260 which will filter out the prominent peak as described above. An alternative strategy for filtering out prominent NMR signals using the recursive RF excitation technique of the present invention employs the presaturation concept disclosed in U.S. Pat. No. 4,715,383. However, by employing the present invention selected spins within the region of interest and within the image can be presaturated to suppress their signals. This recursive presaturation filtering strategy will be explained with respect to the one-dimensional example illustrated in FIGS. 4a–4c. The first step in the method is to employ the recursive technique of the present invention as described above to produce an enhanced NMR echo signal in which the signal produced by the gel-filled tube 221 has been magnified to produce a very prominent peak 223 as shown by the fifth iteration in FIG. 4c. This recursively produced enhanced echo signal is then used to modulate the amplitude of a selective presaturation RF pulse 265 which is shown in FIG. 6. The presaturation pulse 265 is produced in the presence of the same readout gradient pulse 204 used in the recursive pulse sequence, and it selectively excites and saturates the spins in the gel-filled tube 221. As a result, when a conventional NMR pulse sequence begins at the dashed line 266 and an NMR echo signal is acquired at 267, these saturated spins contribute very little to the acquired signal and the prominent feature which they represent is suppressed or filtered out of the resulting reconstructed image. The recursive RF excitation method of the present invention is thus used to form a very selective presaturation RF pulse.

The present invention is also applicable to two-dimensional imaging. The easiest extension of the concept to 2D imaging is illustrated by the pulse sequence of FIG. 7. This pulse sequence is identical to the pulse sequence of FIG. 3 except that the readout gradient is replaced by separate x and y gradient pulses 204a and b and 205a and b. By changing the relative values of these x and y components of the readout gradient, the profile represented by each acquired NMR echo signal 200 is rotated in k-space. This is illustrated in FIG. 8 where the horizontal line 270 is the $k_x$ axis and an NMR echo signal oriented along this axis is produced when the readout gradient is comprised solely of $G_x$ gradient pulses 204a and 205a. A vertical line 271 is the $k_y$ axis and an NMR echo signal oriented along the axis is produced when the readout gradient is comprised solely of $G_y$ gradient pulses 204b and 205b.

Projection data can be acquired at any angle between these two axes $k_x$ and $k_y$ by altering the relative strengths of the $G_x$ and $G_y$ gradient pulses 204a and b and 205a and b. These other projections are indicated by the dashed lines 272 in FIG. 8, and it should be apparent to those skilled in the art that any desired number of such projections can be acquired during a scan and an image reconstructed therefrom using a back projection reconstruction technique. It should also be apparent that any of the above-described enhancement or filtering techniques may be applied to each of the projection data sets. In other words, the NMR echo signal 200 may be employed in a subsequent pulse sequence to modulate the RF excitation pulse 210 to enhance features, it may be filtered before being used in the recursive process to remove prominent features, or it can be used as a selective presaturation pulse in a subsequent pulse sequence.

It should be apparent from the above description that when the relative values of the two gradients $G_x$ and $G_y$ remain constant during the RF excitation and the echo signal readout, projection data along a straight line in k-space is acquired. It is also possible, however, to apply the present invention to pulse sequences in which the RF excitation traverses a curved path in k-space. Such two-dimensional selective excitation employs two, orthogonal, time varying magnetic gradients concurrently with the RF excitation pulse. As described in U.S. Pat. No. 4,812,760 entitled "Multi-Dimensional Selective NMR Excitation With A Single RF Pulse," the time variations in the two orthogonal gradients and the amplitude envelope of the concurrent RF excitation pulse can be chosen to provide different shaped excitation patterns in k-space.

Figure 9A:
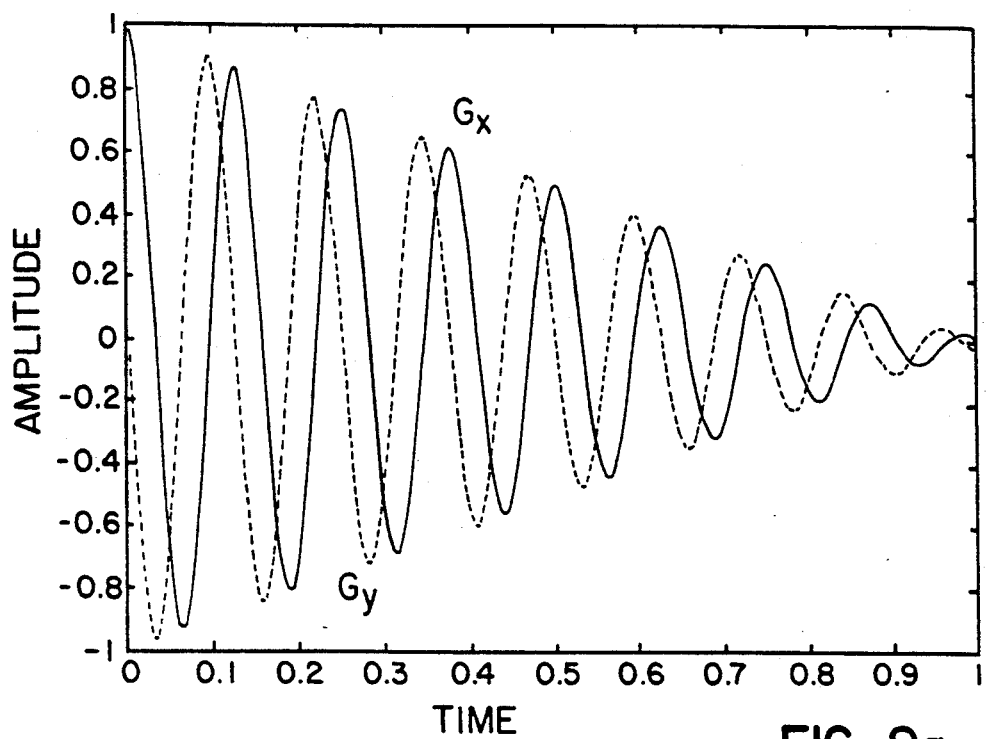
FIGS. 9a and 9b are graphic illustrations of a two-dimensional RF excitation method which may be employed as yet another embodiment of the present invention.
Figure 9B:
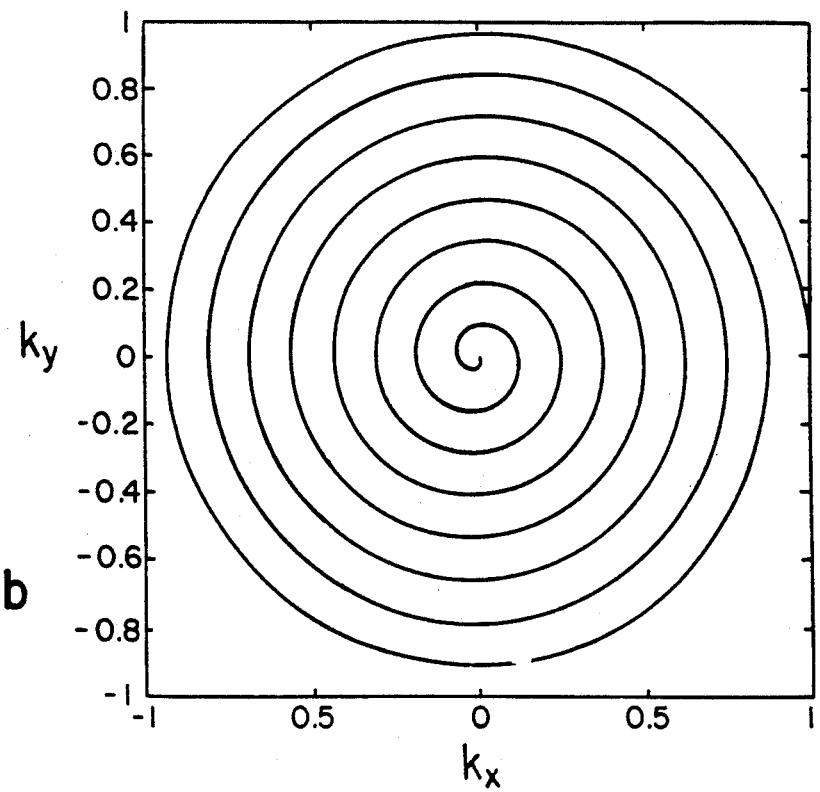

One such two-dimensional selective excitation pulses is disclosed in an article by John Pauley et al. entitled "K-Space Analysis Of Small-tip-angle Excitation," *Journal of Magnetic Resonance* 81, 43–56 (1989). This method uniformly excites a cylindrical region by producing two orthogonal gradients which vary sinusoidally and diminish to zero during the application of the RF excitation pulse. These gradient waveforms are illustrated in FIG. 9a. This method of two-dimensional selective excitation is referred to in the art as "spiral two-dimensional selective excitation" because the vector sum of the two applied orthogonal gradients map out a spiral pattern in k-space as illustrated in FIG. 9b.

Figure 7:
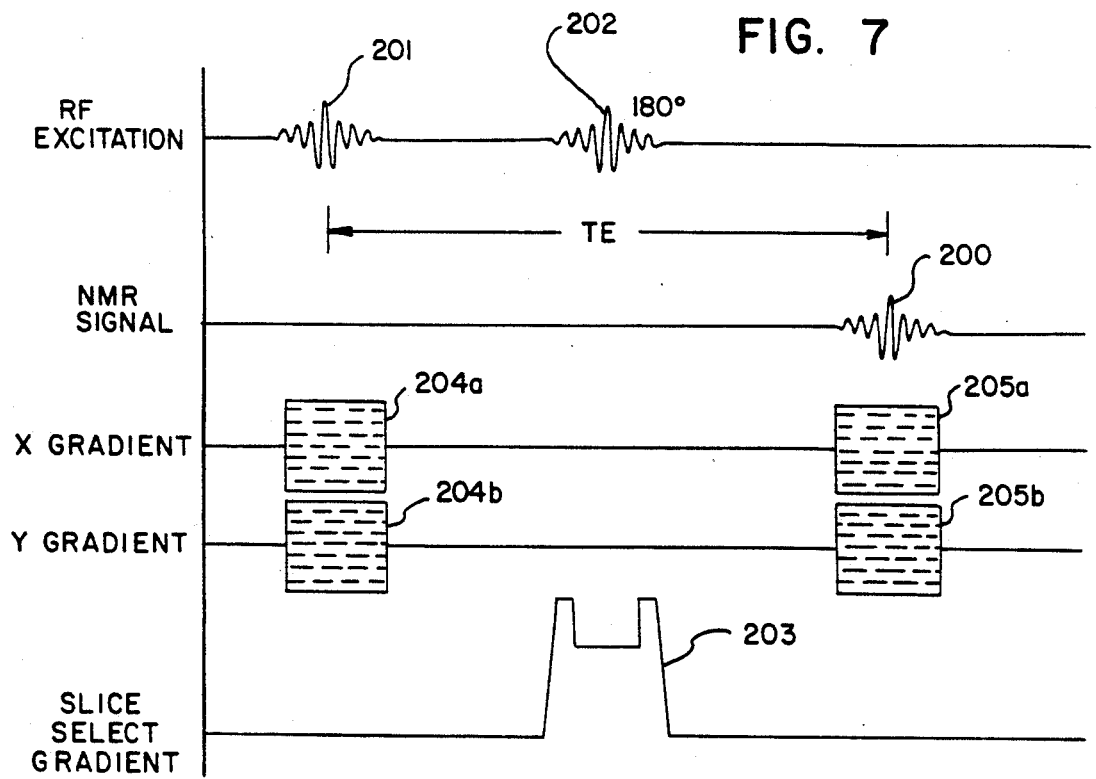
FIG. 7 is a pulse sequence employed in the NMR system of FIG. 1 to practice yet another alternative embodiment of the invention.
Figure 8:
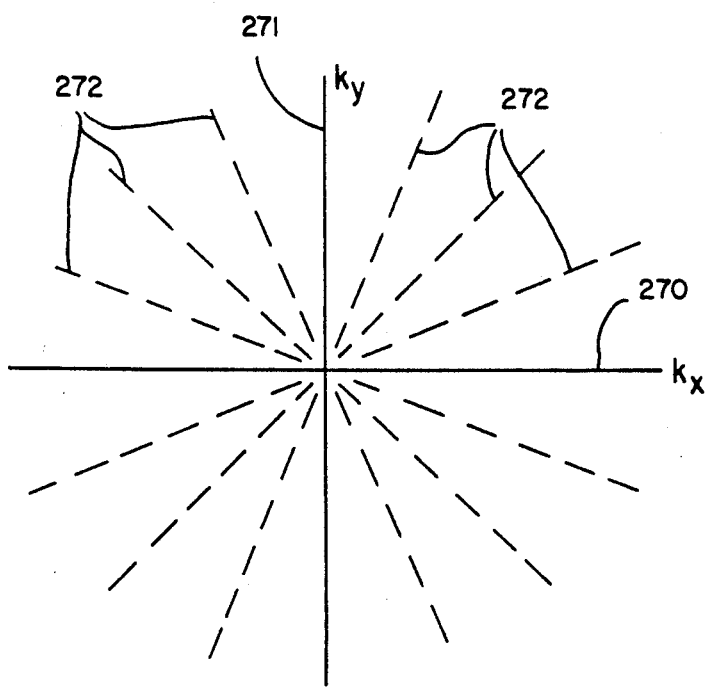
FIG. 8 is a graphic illustration used to explain how the pulse sequence of FIG. 7 acquires NMR data throughout k-space.

The recursive RF excitation method of the present invention is applied to such two-dimensional selective excitation pulse sequences by employing the gradient wave forms in FIG. 9a as the readout gradient pulses 204a and b and 205a and b in the pulse sequence of FIG. 7. During the first iteration the RF excitation pulse 201 m-ay uniformly excite the spins and the spiral gradient pulses 204a and b are not applied. The acquired NMR echo signal 200 is then employed to determine the amplitude envelope of the RF excitation pulse 201 during subsequent iterations, when the spiral gradient pulses 204a and b are applied. As a result, after a few iterations the amplitude envelope of the RF excitation pulse 201 has changed to selectively excite spins which produce prominent peaks in the NMR echo signal rather than uniformly excite the spins within a cylindrical volume as is usually done. This ununiform two-dimensional RF excitation pulse can then be used as a presaturation pulse which precedes either a conventional 2DFT imaging pulse sequence or a gradient localized spectroscopy pulse sequence. In the alternative, the resulting uniform two-dimensional RF excitation pulse can be used in the pulse sequence of FIG. 7 to enhance or filter out prominent features.

It should be apparent to those skilled in the art that the recursive RF excitation of the present invention may be employed in a wide variety of pulse sequences to implement a variety of imaging strategies. It can be employed in one-dimensional or multi-dimensional NMR imaging or spectroscopy. It can be employed to enhance prominent features in the subject, or it can be employed to selectively filter out prominent features or selected regions. Also, the recursive RF excitation can be employed to produce selective presaturation pulses that may be applied prior to conventional pulse sequences to saturate spins within the region of interest in a selective manner.

We claim:

1. In an NMR system for acquiring an NMR echo signal by executing a pulse sequence in which a first RF excitation pulse produces transverse magnetization in spins subject to a polarizing magnetic field and an NMR echo signal is subsequently produced and acquired by a receiver, the improvement comprising:
   means for storing the acquired NMR echo signal;
   means coupled to the storing means for producing an RF excitation waveform that has a shape which is determined by the acquired NMR echo signal; and
   means coupled to the last named means for executing a pulse sequence in which an RF excitation pulse has a waveform determined by the acquired NMR echo signal from a previous pulse sequence.

2. A method for producing an NMR echo signal in an NMR system, which includes:
   producing transverse magnetization in spins subjected to a polarizing magnetic field by generating an RF excitation pulse;
   acquiring an NMR echo signal which is produced as a result of the transverse magnetization;
   employing the acquired NMR echo signal to determine the shape of a subsequent RF excitation pulse;
   producing further transverse magnetization in spins subjected to the polarizing magnetic field by generating said subsequent RF excitation pulse and
   acquiring a further NMR echo signal produced as a result of the further transverse magnetization.

3. The method as recited in claim 2 in which a readout magnetic field gradient is applied to the spins while the RF excitation pulses are produced and while the NMR echo signals are acquired.

4. The method as recited in claim 2 in which an RF echo pulse is produced after each of the RF excitation pulses and before the acquisition of each of the NMR echo signals.

5. The method as recited in claim 2 in which the shape of the subsequent RF excitation pulse is substantially the same as the shape of the acquired NMR echo signal.

6. The method as recited in claim 5 in which the shape of the subsequent RF excitation pulse is determined by modulating the amplitude of an RF carrier signal.

7. The method as recited in claim 2 in which the acquired NMR echo signal is employed to determine the shape of a subsequent RF excitation pulse by:
   a) Fourier transforming the acquired NMR echo signal;
   b) altering the shape of the transformed NMR echo signal to produce filtered projection data; and
   c) inverse Fourier transforming the filtered projection data.

8. The method as recited in claim 7 in which step b) is performed by locating a prominent peak in the transformed NMR echo signal and reducing the value of the transformed NMR echo signal at the located prominent peak.

9. The method as recited in claim 3 in which the readout magnetic field gradient has components directed along two axes.

10. In an NMR system a method for acquiring NMR data for producing an image, the steps comprising:
    a) producing a selective presaturation RF pulse by;
       i) producing transverse magnetization in spins subjected to a polarizing magnetic field by generating an RF excitation pulse;
       ii) acquiring an NMR signal which is produced as a result of the transverse magnetization; and
       iii) employing the acquired NMR signal to determine the shape of the selective presaturation RF pulse;
    b) applying the selective presaturation RF pulse to the spins subjected to the polarizing magnetic field; and
    c) performing a pulse sequence to acquire an NMR signal from the spins subjected to the polarizing magnetic field, the NMR signal being used to produce an image.

11. The method as recited in claim 10 in which a readout gradient field is applied to the spins when the RF excitation pulse is generated and the NMR signal is acquired in step a).

12. The method as recited in claim 11 in which the readout gradient has components directed along two axes.

13. The method as recited in claim 12 in which the components of the readout gradient are time varying.

* * * * *

UNITED STATES PATENT AND TRADEMARK OFFICE
CERTIFICATE OF CORRECTION

PATENT NO. : 5,185,574
DATED : February 9, 1993
INVENTOR(S) : Richard L. Ehman, et al It is certified that error appears in the above-indentified patent and that said Letters Patent is hereby corrected as shown below:

Cover Page

Item [21] Appln. No.: 342,980 should be 742,980.

In the Specification

Col. 5, line 21, "r FIG. 3", should be --FIG. 3--.

Col. 6, line 44, "$G_x = \partial B_z \partial x$, $G_y = \partial B_z/\partial y$", should be --$G_x = \partial B_z/\partial x$, $G_y = \partial B_z/\partial y$--.

Col. 10, line 61, "filled tube are", should be --filled tube 221 are --.

UNITED STATES PATENT AND TRADEMARK OFFICE
CERTIFICATE OF CORRECTION

PATENT NO. : 5,185,574
DATED : February 9, 1993
INVENTOR(S) : Richard L. Ehman et al It is certified that error appears in the above-indentified patent and that said Letters Patent is hereby corrected as shown below:

Col. 11, line 13, begin new paragraph starting with the sentence "An alternative strategy...".

Col. 11, line 40, "suppressed or", should be --suppressed, or--.

Col. 12, line 46, "201 m-ay", should be --201 may--.

Signed and Sealed this

Twenty-eighth Day of December, 1993

Attest:

BRUCE LEHMAN

Attesting Officer   Commissioner of Patents and Trademarks